United States Patent
Hau-Riege et al.

(10) Patent No.: US 7,153,774 B2
(45) Date of Patent: Dec. 26, 2006

(54) METHOD OF MAKING A SEMICONDUCTOR DEVICE THAT HAS COPPER DAMASCENE INTERCONNECTS WITH ENHANCED ELECTROMIGRATION RELIABILITY

(75) Inventors: Stefan Hau-Riege, Milpitas, CA (US); Christine Hau-Riege, Milpitas, CA (US); Wen-Yue Zheng, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 590 days.

(21) Appl. No.: 10/165,679

(22) Filed: Jun. 6, 2002

(65) Prior Publication Data

US 2003/0228753 A1 Dec. 11, 2003

(51) Int. Cl.
*H01L 21/44* (2006.01)
(52) U.S. Cl. ............... 438/687; 438/660; 438/680; 438/681; 257/E21; 257/584
(58) Field of Classification Search ........... 438/626, 438/643, 629, 627, 660, 663, 650, 685, 687, 438/681, 680, 697, 692, 700, 706, 734, 735, 438/737, 738, 745, 637, 639, 678, 679, 931
See application file for complete search history.

(56) References Cited

U.S. PATENT DOCUMENTS

| 5,614,764 | A | | 3/1997 | Baerg et al. ............... 257/767 |
| 5,904,560 | A | | 5/1999 | Brumley ..................... 438/639 |
| 5,909,635 | A | | 6/1999 | Marieb et al. .............. 438/625 |
| 6,147,000 | A | * | 11/2000 | You et al. ................... 438/687 |
| 6,191,029 | B1 | * | 2/2001 | Hsiao et al. ................ 438/633 |
| 6,336,569 | B1 | * | 1/2002 | Joshi .......................... 257/750 |
| 6,433,402 | B1 | * | 8/2002 | Woo et al. .................. 257/525 |

OTHER PUBLICATIONS

N.E. Meier, et al., "Electromigration Voiding in Argon-Implanted Interconnects", Mat. Res. Soc. Symp. Proc. vol. 563, pp. 97-102, (1999).

* cited by examiner

*Primary Examiner*—David Nhu
(74) *Attorney, Agent, or Firm*—Michael D. Plomie

(57) ABSTRACT

A method of making a semiconductor device is described. That method includes forming a copper containing layer on a substrate, and forming an alloying layer that includes an alloying element on the copper containing layer. After applying heat to cause an intermetallic layer that includes copper and the alloying element to form on the surface of the copper containing layer, a barrier layer is formed on the intermetallic layer.

12 Claims, 3 Drawing Sheets

METHOD OF MAKING A SEMICONDUCTOR DEVICE THAT HAS COPPER DAMASCENE INTERCONNECTS WITH ENHANCED ELECTROMIGRATION RELIABILITY

FIELD OF THE INVENTION

The present invention relates to a method of making semiconductor devices, in particular, devices that include copper damascene interconnects.

BACKGROUND OF THE INVENTION

When making advanced semiconductor devices, copper interconnects may offer a number of advantages over those made from aluminum. For that reason, copper has become the material of choice for making such devices' interconnects. As device dimensions shrink so does conductor width—leading to higher resistance and current density. Increasing current density can increase the rate at which copper atoms are displaced when current passes through a copper conductor. Such electromigration can cause vacancies, which may lead to voids. Those voids may form at the interface between the copper conductor and a barrier layer that is formed on the conductor. If a void grows to a size that creates metal separation, e.g., near a via that contacts the conductor, it may cause an open-circuit failure.

One way to prevent electromigration from causing interconnect failure is to limit the amount of current that passes through the conductor. That solution to the electromigration problem is impractical, however, because devices will operate at progressively higher currents, even as they continue to shrink. As an alternative, reliability can be enhanced by slowing metal diffusion along the fastest diffusion path—i.e., along the copper/barrier layer interface. Applying various surface treatments, e.g., exposing the copper layer to ammonia and/or silane prior to forming the barrier layer on the copper layer, may reduce metal diffusion along that interface. Introducing dopants into the copper layer may also limit diffusion. Unfortunately, these techniques for reducing the rate at which copper diffuses may raise the resistance of the copper layer significantly.

Accordingly, there is a need for an improved process for making a semiconductor device that includes copper interconnects. There is a need for such a process that reduces electromigration without significantly raising conductor resistance. The method of the present invention provides such a process.

DETAILED DESCRIPTION OF THE PRESENT INVENTION

A method for making a semiconductor device is described. That method comprises forming a copper containing layer on a substrate, then forming an alloying layer that includes an alloying element on the copper containing layer. After applying heat to cause an intermetallic layer that includes copper and the alloying element to form on the surface of the copper containing layer, a barrier layer is formed on the intermetallic layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
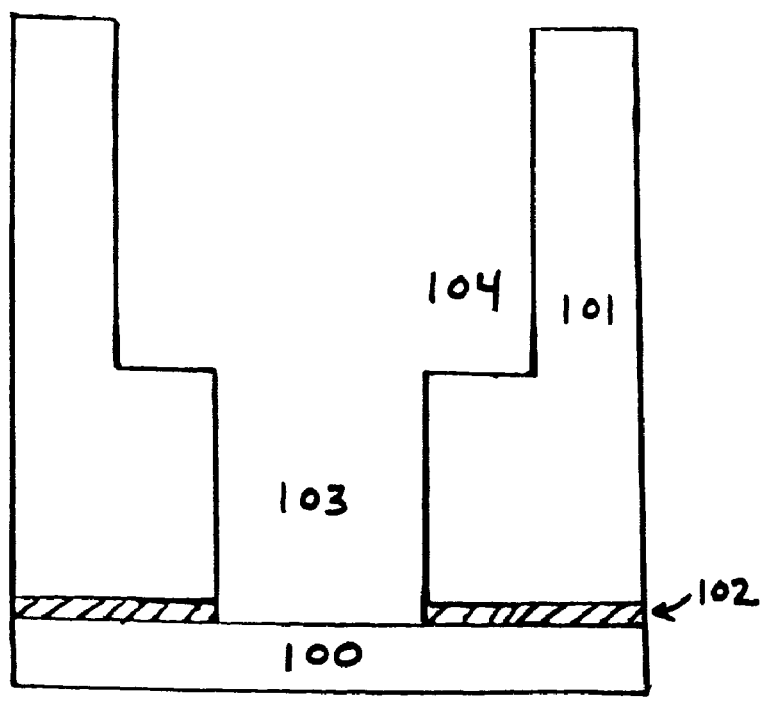
FIGS. 1a–1f represent cross-sections of structures that may result when certain steps are used to make a semiconductor device using an embodiment of the method of the present invention.
Figure 1B:
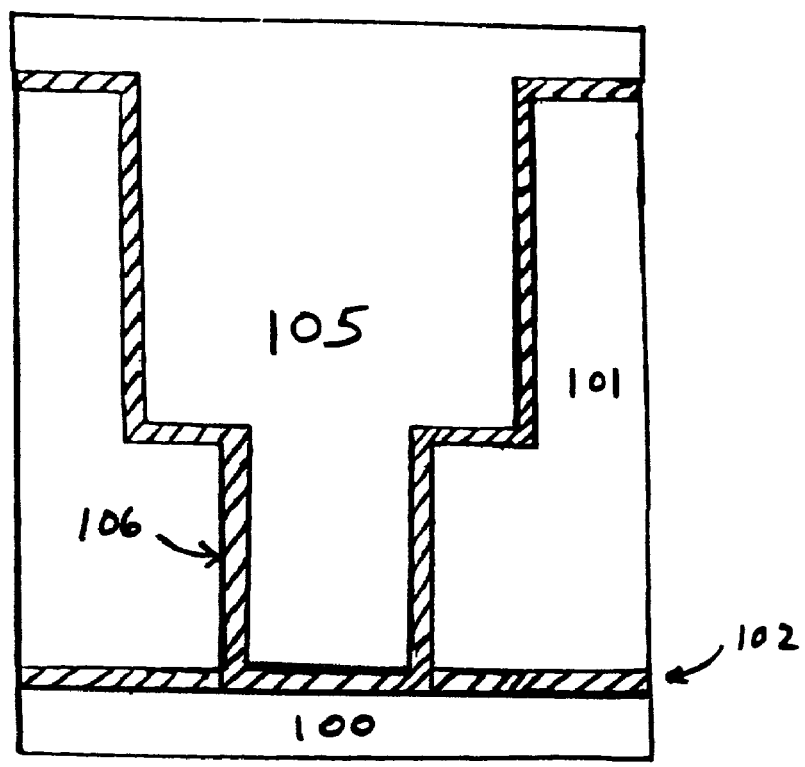
Figure 1C:
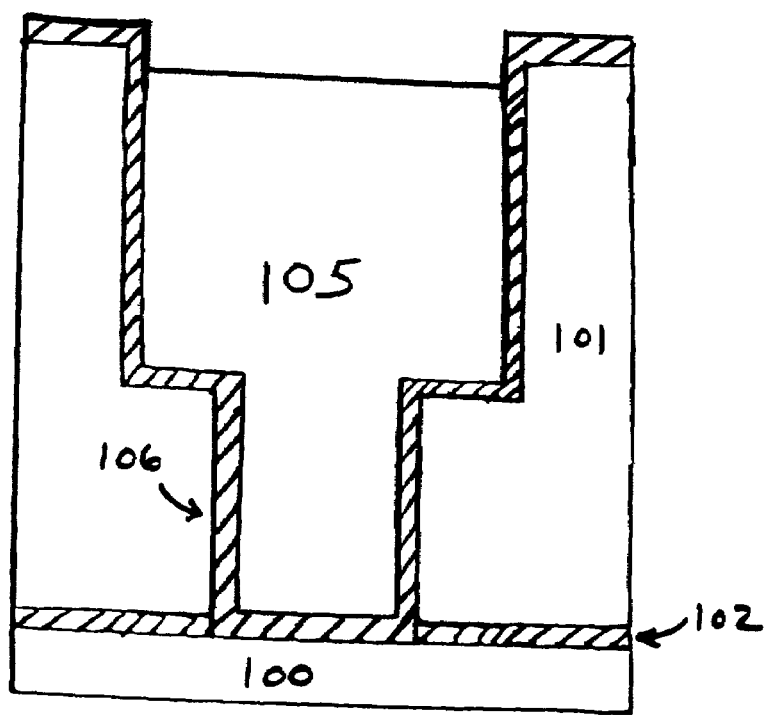

FIGS. 1a–1f represent cross-sections of structures that may be formed when making a semiconductor device using the method of the present invention to reduce electromigration in a copper conductor. FIG. 1a represents a structure in which barrier layer 102 is formed on substrate 100 and dielectric layer 101 is formed on barrier layer 102. Substrate 100 may be any surface, generated when making a semiconductor device, upon which a dielectric layer may be formed. Barrier layer 102 will serve to prevent an unacceptable amount of copper, or other metal, from diffusing into dielectric layer 101. Barrier layer 102 may also act as an etch stop, protecting an underlying conductive layer during via and trench etch and cleaning steps.

In the method of the present invention, barrier layer 102 preferably comprises silicon nitride, but may be made from other materials that can serve such functions, e.g., silicon carbide, silicon oxycarbide or silicon oxynitride. A conventional chemical vapor deposition ("CVD") process may be used to form barrier layer 102. Barrier layer 102 should be thick enough to perform its diffusion inhibition and etch stop functions, but not so thick that it adversely impacts the overall dielectric characteristics resulting from the combination of barrier layer 102 and dielectric layer 101. To balance these two factors, the thickness of barrier layer 102 preferably should be less than about 10% of the thickness of dielectric layer 101. In a preferred embodiment, barrier layer 102 is between about 10 and 50 nanometers thick.

Dielectric layer 101 may comprise any material that may insulate one conductive layer from another. Preferred are insulating materials with a dielectric constant that is lower than the dielectric constant of silicon dioxide, e.g., porous oxide; carbon or fluorine doped oxide; organic containing silicon oxides; or various polymers. A particularly preferred material for making dielectric layer 101 is a fluorine doped oxide, which may be deposited onto barrier layer 102 using a conventional high density plasma ("HDP") process.

When a fluorine doped oxide is used to make dielectric layer 101, the capacitance between various conductive elements that are separated by layer 101 will be reduced, when compared to the capacitance resulting from use of conventionally used dielectric materials—such as silicon dioxide. Such reduced capacitance may decrease the RC delay that would otherwise exist and may also decrease undesirable cross-talk between conductive lines. This, in turn, should allow the device to operate at a higher speed.

Dielectric layer 101 may alternatively comprise an organic polymer. Such organic polymers include, for example, polyimides, parylenes, polyarylethers, organo-silicones, polynaphthalenes, and polyquinolines, or copolymers thereof. Commercially available polymers sold by Honeywell, Inc., under the trade name FLARE™, and by the Dow Chemical Company, under the trade name SiLK™, may be used to form dielectric layer 101. When dielectric layer 101 comprises a polymer, it is preferably formed by spin coating the polymer onto the surface of barrier layer 102 using conventional equipment and process steps. Dielectric layer 101 preferably has a thickness of between about 100 and about 2,000 nanometers.

In the embodiment of the present invention described with reference to FIGS. 1a–1f, dielectric layer 101 comprises a single layer. In alternative embodiments, multiple layers of dielectric material may be deposited to form dielectric layer 101, e.g., to generate a dielectric stack that benefits from the different properties of the different materials.

After forming dielectric layer 101 on barrier layer 102, a series of conventional lithographic, etching and cleaning steps may be applied to produce the structure represented by FIG. 1a, in which via 103 and trench 104 have been etched into dielectric layer 101. In this embodiment, via 103 is etched through barrier layer 102.

After the via and trench are etched, barrier layer 106 is formed, which lines the via and trench bottom and walls. Barrier layer 106 will block diffusion into dielectric layer 101 of copper (or other elements) that will subsequently fill via 103 and trench 104. Barrier layer 106 preferably comprises a refractory material, such as tantalum, tantalum nitride or titanium nitride, but may be made from other materials that can inhibit diffusion of copper into dielectric layer 101. Barrier layer 106 preferably comprises a two layer stack that includes an underlying tantalum nitride layer upon which is formed a tantalum layer. Barrier layer 106 preferably is between about 10 and 50 nanometers thick, and preferably is formed using a conformal physical vapor deposition ("PVD") or plasma enhanced CVD process.

After forming barrier layer 106, via 103 and trench 104 are filled with a copper containing material to form copper containing layer 105. This generates the structure shown in FIG. 1b. Copper containing layer 105 may be formed using a conventional copper electroplating process. Such a process typically comprises depositing a seed material (e.g., one made of copper) on barrier layer 106, then performing a copper electroplating process to produce the copper line, as is well known to those skilled in the art.

At this stage of the process, copper containing layer 105 may be undoped, or lightly doped with an electromigration retarding amount of an element that will not significantly increase layer 105's resistance. Appropriate dopants that may be used are well known to those skilled in the art, as are techniques for adding such dopants to that layer. The optimum dopant concentration will depend upon layer 105's dimensions and other characteristics, and the type of dopant used.

After copper containing layer 105 is deposited, it is polished, e.g., by applying a CMP step, until its surface is recessed slightly below the surface of dielectric layer 101. That polishing step may be followed by a standard cleaning process. Copper containing layer 105 must be recessed sufficiently deep into dielectric layer 101 to ensure that a subsequently formed intermetallic layer will maintain a sufficient thickness to serve as an electromigration reducing agent. In a preferred embodiment, copper containing layer 105 is polished until its upper surface is separated from the surface of dielectric layer 101 by at least about 5 nanometers, and more preferably between about 5 and about 50 nanometers.

To form a copper containing layer that is sufficiently recessed, it may be necessary to remove more of layer 105 than can be removed using a typical CMP process. There are many ways to remove additional amounts of copper containing layer 105. For example, when barrier layer 106 comprises tantalum, copper containing layer 105 may be recessed by using a tantalum selective slurry in the CMP process. A further recessed copper containing layer may be formed by adjusting CMP process parameters—such as by enhancing the chemical etch contribution to the polishing process near the end of that treatment. Copper containing layer 105 may be further recessed by applying a selective wet etch process (which follows a conventional CMP polish and clean sequence) to etch the copper at a significantly faster rate than it etches barrier layer 106 or dielectric layer 101.

Alternatively, an electropolish process may be applied to generate a relatively highly recessed copper containing layer. Such a process is well known to those skilled in the art, consisting essentially of contacting the surface to be polished with an appropriate solution chemistry, then applying an electrical potential to that surface. See, e.g., R. Contolini, A. Bernhardt, and S. Mayer, *Electrochemical Planarization for Multilevel Metallization*, J. Electrochem. Soc., Vol. 141, No. 9, pp. 2503–2510 (Sep. 1994). Removing part of copper containing layer 105, without simultaneously removing a significant portion of barrier layer 106, produces the structure shown in FIG. 1c.

Figure 1D:
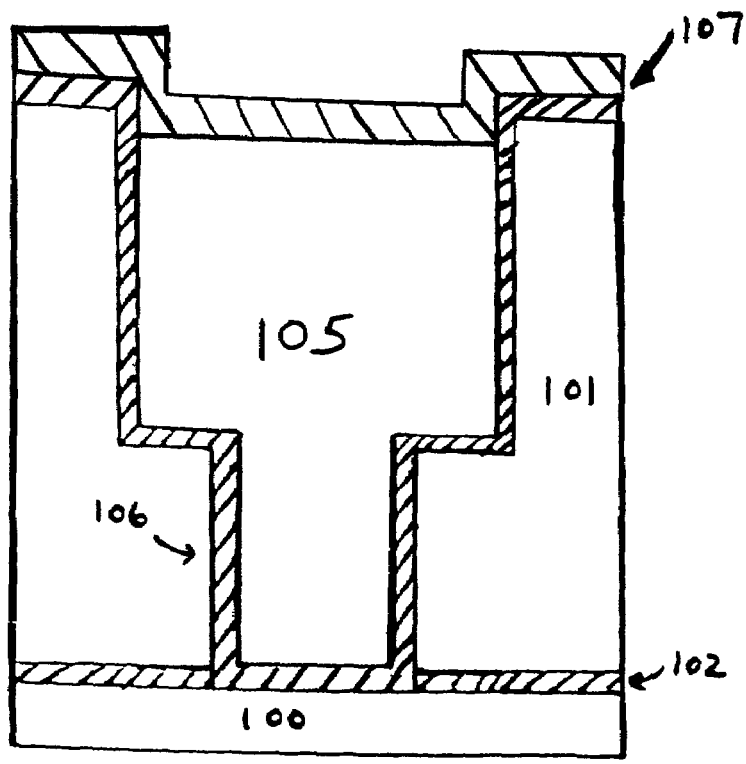

After forming recessed copper containing layer 105, a three step process may follow to form an intermetallic layer on copper containing layer 105. First, alloying layer 107, which includes an alloying element, is deposited over barrier layer 106 and copper containing layer 105 using, for example, a conventional PVD or other appropriate deposition process. Layer 107 should be deposited at an adequate thickness such that between about 5 and about 50 nanometers of a subsequently formed intermetallic layer will remain on top of copper containing layer 105, after alloying layer 107 is removed from the surface of barrier layer 106. The resulting structure is shown in FIG. 1d.

The alloying element included in alloying layer 107 must be able to bond with copper to form an intermetallic layer that comprises copper and the alloying element. In addition, it should not diffuse into the bulk of copper containing layer 105, and should have a low solubility in copper, to prevent a significant increase in the resistance of layer 105. Nor should the alloying element diffuse into dielectric layer 101 or react with barrier layer 106. Most importantly, the alloying element should ensure relatively low electromigration along the interface between copper containing layer 105 and the subsequently formed intermetallic layer.

A suitable alloying element may be selected from calcium, cerium, cadmium, erbium, manganese, tin, zirconium, gold, and nickel. This list is not exclusive, as other materials that have appropriate diffusion, solubility and electromigration retarding properties may be used instead. In this regard, the alloying element may comprise any material that may form with copper an intermetallic layer that may serve to reduce electromigration along a copper line, without departing from the spirit and scope of the present invention.

After alloying layer 107 is formed, the resulting structure is annealed to form an intermetallic layer on the surface of copper containing layer 105. Heat is applied at a sufficient temperature for a sufficient time to cause the alloying element in alloying layer 107 to bond with copper contained in copper containing layer 105 to form an intermetallic layer consisting of copper and the alloying element. In a preferred embodiment, heat is applied at between about 300° C. and about 500° C. for a sufficient time to cause the alloying element to bond with the copper. In many cases, a relatively short time period, e.g., a couple of minutes, should be adequate. The optimum temperature and time period that should be applied may depend upon the alloying element used.

The anneal should take place in a forming gas environment (e.g., one including hydrogen and nitrogen) to prevent the alloying element from oxidizing. The resulting intermetallic layer may comprise a compound that has the molecular formula $Cu_xA_{1-x}$, in which "A" represents the alloying element. Preferably, all of the portion of alloying layer 107 that is located on copper containing layer 105 is converted into the intermetallic layer. In alternative embodiments, however, that portion of alloying layer 107 may be partially converted into the intermetallic layer.

Figure 1E:
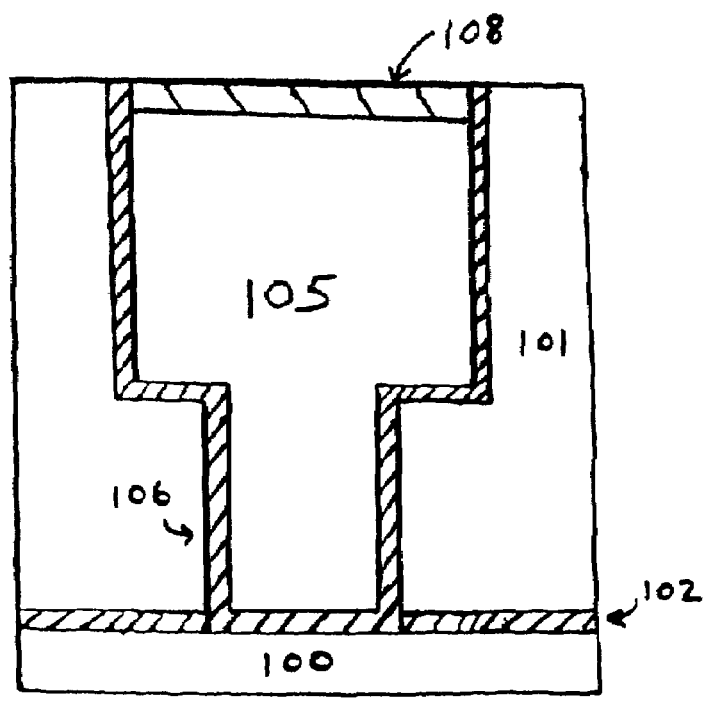

The portions of alloying layer 107 that cover barrier layer 106 are then removed. In a preferred embodiment, those portions are removed using a conventional CMP step. When only part of alloying layer 107 is converted into the intermetallic layer, alloying layer 107 may be deposited at a thickness that is significantly greater than the distance separating copper containing layer 105 from dielectric layer 101. In those embodiments, the part of alloying layer 107 that is not converted into the intermetallic layer is removed from the surface of the intermetallic layer. After removing layer 107, barrier layer 106 is removed from dielectric layer 101. The resulting structure includes intermetallic layer 108 formed on copper containing layer 105, as shown in FIG. 1*e*. When barrier layer 106 comprises tantalum, alloying layer 107 and barrier layer 106 may be polished at substantially the same rate using a slurry that is equally selective to tantalum and alloying layer 107. In a preferred embodiment, the CMP process generates a substantially planar surface along intermetallic layer 108 and dielectric layer 101.

The resulting interface between copper containing layer 105 and intermetallic layer 108 will be metallic. Diffusion along that interface will be relatively slow, when compared to diffusion along a copper/barrier layer interface. To obtain this electromigration reducing benefit, intermetallic layer 108 preferably is between about 5 and about 50 nanometers thick. The optimal thickness will, of course, depend upon the thickness required to provide this benefit for a particular application.

Figure 1F:
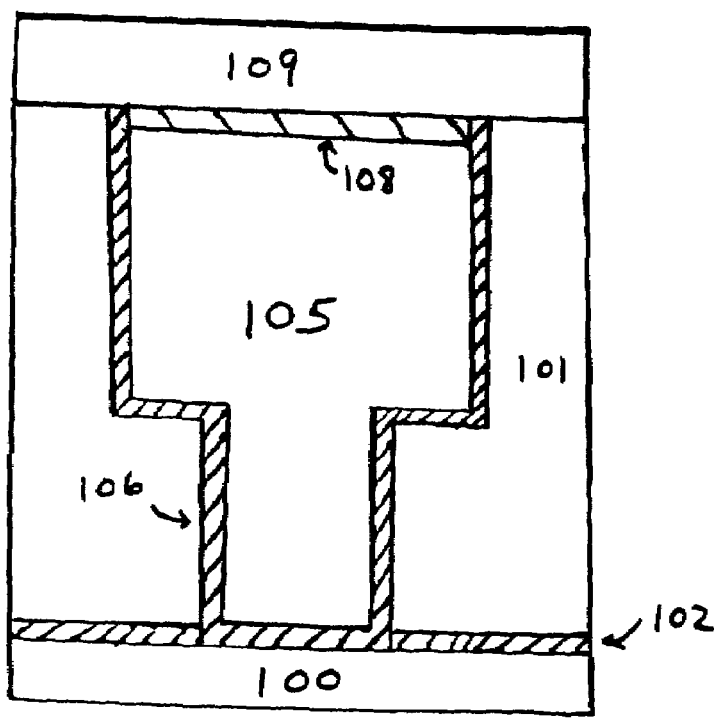

After forming intermetallic layer 108, barrier layer 109 may be deposited on its surface, as shown in FIG. 1*f*. Layer 109 is preferably made from silicon nitride using a conventional CVD process. The same materials, process steps and equipment used to form barrier layer 102 may be used to form barrier layer 109. The process steps described above may be repeated as necessary to generate a device with the desired number of metal levels. After the metal interconnect is formed, conventional process steps may be applied to complete the device.

The method of the present invention may improve interconnect electromigration reliability by forming an intermetallic layer on top of a copper containing layer, such that the intermetallic layer separates the copper containing layer from a barrier layer. Such a structure may show improved electromigration properties, when compared to those of structures that form the barrier layer directly on the copper containing layer. Such an improvement may result as forming a clean interface between the copper layer and the copper-metal intermetallic layer may provide an optimum way to slow diffusion that can take place along the copper line.

Forming such an intermetallic layer on a recessed surface of a copper containing layer protects the copper/intermetallic layer interface from materials used in the CMP process and from exposure to air. As a result, the method of the present invention should produce devices that exhibit relatively consistent electromigration behavior. Forming the intermetallic layer only on top of the copper containing layer ensures that the intermetallic layer's presence will not affect the bulk of the copper containing layer. That, in turn, should limit the extent to which the presence of the intermetallic layer increases interconnect resistance.

Electromigration induced voiding in copper interconnects may occur along the copper/barrier layer interface. The process of the present invention reduces interconnect electromigration by replacing that interface with a copper/intermetallic interface. Such an interface will slow diffusion, serving to limit electromigration. Unlike current methods, which rely on various surface treatments and/or relatively substantial doping of the copper line to reduce electromigration, the method of the present invention may serve to reduce electromigration without significantly increasing conductor resistance.

Features shown in the above referenced drawings are not intended to be drawn to scale, nor are they intended to be shown in precise positional relationship. Additional steps that may be included in the above described method have been omitted as they are not useful to describe aspects of the present invention.

Although the foregoing description has specified certain steps and materials that may be used in the above described method for making a semiconductor device with a copper containing layer that has improved electromigration reliability, those skilled in the art will appreciate that many modifications and substitutions may be made. For example, although the embodiment described with reference to FIGS. 1*a*–1*f* applies the method of the present invention to a dual damascene process for making a copper interconnect, the method may be applied to single damascene processes for forming copper lines, and various other processes for making semiconductor devices. Accordingly, it is intended that all such modifications, alterations, substitutions and additions be considered to fall within the spirit and scope of the invention as defined by the appended claims.

What is claimed is:

1. A method of making a semiconductor device comprising:

forming a copper containing layer on a substrate, the copper containing layer having a surface;

forming an alloying layer that includes an alloying element on the copper containing layer, wherein the alloying element comprises a metal selected from the group consisting of calcium, cerium, cadmium, erbium, manganese, zirconium, gold, and nickel;

applying heat to cause an intermetallic layer that includes copper and the alloying element to form on the surface of the copper containing layer; and forming a barrier layer on the intermetallic layer.

2. The method of claim 1 further comprising:

polishing the copper containing layer, after it is formed, generating a recessed region on top of the copper containing layer;

filling that recessed region with the alloying layer, the alloying layer also forming on the substrate; and then polishing the alloying layer, after the heating step, to remove it from the substrate, while retaining the intermetallic layer within the recessed region.

3. The method of claim 2 wherein the recessed region is between about 5 and about 50 nanometers deep.

4. The method of claim 1 wherein heat is applied at between about 300° C. and about 500° C. for a sufficient time to form the intermetallic layer.

5. A method of making a semiconductor device comprising:

forming a dielectric layer on a substrate, the dielectric layer having a surface;

forming a trench within the dielectric layer;

forming a copper containing layer on the dielectric layer, the copper containing layer having a surface and filling the trench;

removing the copper containing layer from the surface of the dielectric layer, while retaining the copper containing layer where it fills the trench;

forming an alloying layer that includes an alloying element on the copper containing layer and the dielectric layer, wherein the alloying element comprises a metal selected from the group consisting of calcium, cerium, cadmium, erbium, manganese, zirconium, gold, and nickel;

applying heat to cause an intermetallic layer that includes copper and the alloying element to form on the surface of the copper containing layer;

removing the alloying layer from the dielectric layer, while retaining the intermetallic layer where it covers the copper containing layer; and forming a barrier layer on the intermetallic layer.

6. The method of claim 5 further comprising:

removing the copper containing layer by polishing it, generating a copper containing layer with a surface that is recessed below the top surface of the dielectric layer, where the copper containing layer fills the trench;

forming the alloying layer on the recessed surface of the copper containing layer and the dielectric layer; and then polishing the alloying layer, after the heating step, to remove it from the dielectric layer, while retaining the intermetallic layer on the recessed surface of the copper layer.

7. The method of claim 6 wherein the recessed surface of the copper containing layer is separated from the top surface of the dielectric layer by between about 5 and about 50 nanometers.

8. A method of making a semiconductor device comprising:

forming a dielectric layer on a substrate, the dielectric layer having a top surface;

forming a trench within the dielectric layer;

lining the trench with a first barrier layer;

forming a copper containing layer on the first barrier layer, the copper containing layer having a surface and filling the trench;

polishing the copper containing layer until its surface is recessed below the top surface of the dielectric layer, where the copper containing layer fills the trench;

forming an alloying layer that includes an alloying element on the recessed surface of the copper containing layer and on the first barrier layer, wherein the alloying element comprises a metal selected from the group consisting of calcium, cerium, cadmium, erbium, manganese, zirconium, gold, and nickel;

applying heat to cause an intermetallic layer that includes copper and the alloying element to form on the surface of the copper containing layer; and then polishing the alloying layer to remove it from the first barrier layer, while retaining the intermetallic layer on the recessed surface of the copper layer; and forming a second barrier layer on the intermetallic layer.

9. The method of claim 8 wherein the intermetallic layer is between about 5 and about 50 nanometers thick.

10. The method of claim 8 wherein the first barrier layer is also formed on the dielectric layer, and wherein the first barrier layer remains on the dielectric layer after the copper containing layer is polished.

11. The method of claim 10 wherein the first barrier layer comprises tantalum and the copper containing layer is polished using a slurry that is selective to tantalum.

12. The method of claim 11 wherein the first barrier layer is removed from the dielectric layer after the alloying layer is removed from the first barrier layer to generate a substantially planar surface along the intermetallic layer and the dielectric layer.

* * * * *